(12) United States Patent
Wu

(10) Patent No.: US 7,196,565 B2
(45) Date of Patent: *Mar. 27, 2007

(54) DC LEVEL WANDERING CANCELLATION CIRCUIT

(75) Inventor: Li-Te Wu, Hsinchu (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 11/308,883

(22) Filed: May 22, 2006

(65) Prior Publication Data

US 2006/0244507 A1 Nov. 2, 2006

Related U.S. Application Data

(63) Continuation of application No. 10/709,606, filed on May 18, 2004, now Pat. No. 7,102,409.

(51) Int. Cl.
*H03L 5/00* (2006.01)
(52) U.S. Cl. .............................. 327/307; 327/77; 327/87
(58) Field of Classification Search ........ 327/306–307, 327/50, 72, 74, 76, 77, 78, 80, 81, 85, 87, 327/89; 330/9
See application file for complete search history.

(56) References Cited

U.S. PATENT DOCUMENTS

| | | | | |
|---|---|---|---|---|
| 4,297,642 | A * | 10/1981 | Baldwin et al. | 330/9 |
| 4,377,759 | A * | 3/1983 | Ohhata et al. | 327/337 |
| 6,246,282 | B1 * | 6/2001 | Oono et al. | 330/86 |
| 7,102,409 | B2 * | 9/2006 | Wu | 327/307 |

* cited by examiner

*Primary Examiner*—Long Nguyen
(74) *Attorney, Agent, or Firm*—Jiang Chyun IP Office

(57) ABSTRACT

A DC level wandering cancellation circuit is provided. The DC level wandering cancellation circuit comprises a low pass filter, for receiving an input voltage; a high pass filter coupled to the low pass filter; an amplifier coupled to the high pass filter for receiving a reference voltage and an output signal of the high pass filter; a comparator coupled to the amplifier for receiving an output signal of the amplifier to compare the reference voltage with the output signal of the amplifier; a resistor coupled between outputs of the high pass filter and the amplifier; a control logic coupled to the comparator for receiving a compared result from the comparator; and a switching means coupled between the high pass filter and the output of the amplifier. The switching means is turned on for a predetermined interval by the control logic according to the compared result.

2 Claims, 3 Drawing Sheets

DC LEVEL WANDERING CANCELLATION CIRCUIT

CROSS-REFERENCE TO RELATED APPLICATION

This is a continuation application of application Ser. No. 10/709,606, filed on May 18, 2004 and is now U.S. Pat. No. 7,102,409. The entirety of the above-mentioned patent application is hereby incorporated by reference herein and made a part of this specification.

BACKGROUND OF THE INVENTION

1. Field of the Invention

The present invention is generally related to an apparatus generally used in communication technologies. More particularly, the present invention of the apparatus relates to radio frequency identification (RFID) reader.

2. Description of the Related Art

In communication system, there is a serious problem due to improper transmitted data waveform called DC wandering. It usually happens when there is a continuous transmission of high or low signals. There have been a number of coding schemes designed to overcome this problem, for example, Manchester coding. This coding, however, has less bandwidth compare to Non Return to Zero (NRZ) coding scheme. The present invention is regard to overcome the DC wandering problems and a new reader circuit has been invented.

FIG. 1 is an example of the prior art that comprises a first resistor R1, a second resistor R2, a third resistor R3, a first capacitor C1, a second capacitor C2, a diode D1, an amplifier 30, and a comparator 40.

The first terminal of the first capacitor C1 is to receive an input voltage V1, the first terminal of the second capacitor C2 and the first terminal of the first resistor R1 are connected at a node 11. The second terminal of the first capacitor C1 and the second terminal of the first resistor R1 couple to the ground. The second terminal of the second capacitor C2 and the first terminal of the third resistor R3 couple to a negative input terminal of the operational amplifier 30 at a node 13. The reference voltage V2 is input to a positive input terminal of the operational amplifier 30.

The first resistor R1 and the first capacitor C1 form a first order low pass filter. The second resistor R2 and the second capacitor C2 form a high pass filter. The second terminal of the third resistor R3 and the output of the operational amplifier 30 couple to the input terminal of the comparator 40 at the node 14.

FIG. 2 shows the simulation result of the prior art. Referring to FIG. 2, the waveform in the first row shows an input voltage V1. The second row shows the input terminal of the comparator 40 at the node 14. It also shows a hysterias upper bound V7 and a lower bound V6. The third row shows voltage of the output terminal of the comparator 40 at the node 15. Referring to FIG. 2, the voltage at the node 14 is higher than the lower bound V6 of comparator 40 when time is greater than 122 microseconds. As a result, the voltage at the node 15 has no state change after time is greater than 122 microseconds. This error comes from the DC wandering. It has great effects on the output qualities of a communication receiver.

SUMMARY OF THE INVENTION

Accordingly, it is an object of the present invention to provide a filter circuit and a reader circuit suitable for removing a DC wandering effect in a communication receiver.

To achieve these and other advantages and in accordance with the purpose of the invention, as embodied and broadly described herein, the present invention provides a DC level wandering cancellation circuit for removing DC wandering. The DC level wandering cancellation circuit comprises a low pass filter, for receiving an input voltage; a high pass filter coupled to the low pass filter; an amplifier coupled to the high pass filter for receiving a reference voltage and an output signal of the high pass filter; a comparator coupled to the amplifier for receiving an output signal of the amplifier to compare the reference voltage with the output signal of the amplifier; a resistor coupled between outputs of the high pass filter and the amplifier; a control logic coupled to the comparator for receiving a compared result from the comparator; and a switching means coupled between the high pass filter and the output of the amplifier. The switching means is turned on for a predetermined interval by the control logic according to the compared result. When the compared result from the comparator is from a high level to a low level, or from a low level to a high level, an output signal of the control logic changes to a high level to turn on the switching means.

In one embodiment of the present invention, the switching means can be a transistor. The low pass filter further comprises a first resistor and a first capacitor connected in parallel, and the high pass filter further comprises a second resistor and a second capacitor connected in series, wherein the second capacitor is coupled between the first and the second resistors. In this configuration, the switching means is coupled between the control logic and a node between the second capacitor and the second resistor.

The present invention further provides a DC level wandering cancellation method, for a circuit having an inverting-gain amplifier. The method comprises comparing an output signal of the inverting-gain amplifier with a reference voltage; and feeding back the output signal of the inverting-gain amplifier to the inverting-gain amplifier when there is a state change in the compared result. The state change can be a level of the compared result changed from high to low, or from low to high. In this way, the DC wandering can be removed.

Therefore, in accordance with the aforementioned circuit and method, the control logic receives the output of the comparator. The output of the control logic circuit is set high for a short period of time when there is a voltage change from high to low or low to high in the output of the comparator, and is normally low. Subsequently, the switching means is closed for a short period of time. As a consequence, the input and the output of the inverting gain amplifier are shorted. The shorted circuit helps to restore the output of the inverting gain amplifier to the stable state faster. Thus, there is no distortion from the input of the comparator, and therefore, the present invention is unaffected by DC wandering.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
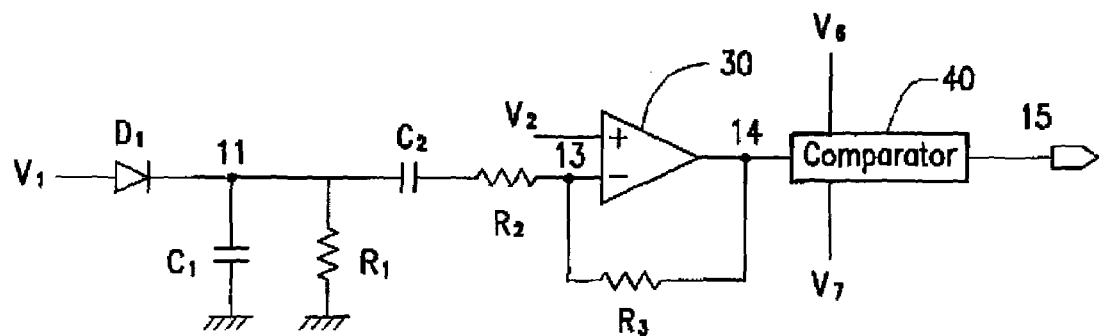
FIG. 1 schematically illustrates a conventional circuit usually used in a RFID reader.
Figure 2:
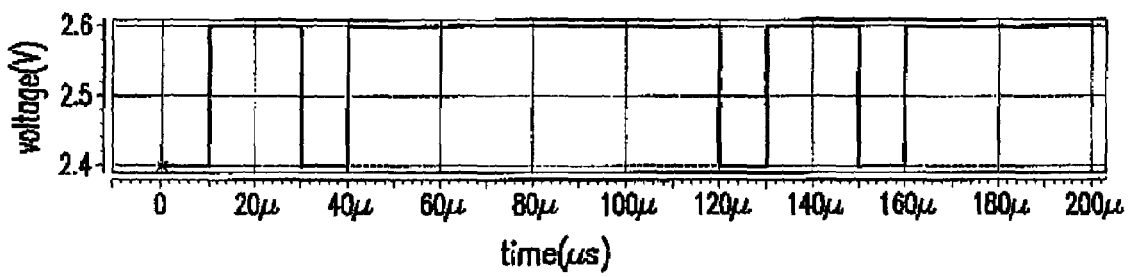
FIG. 2 shows the simulation result of the prior art.
Figure 2:
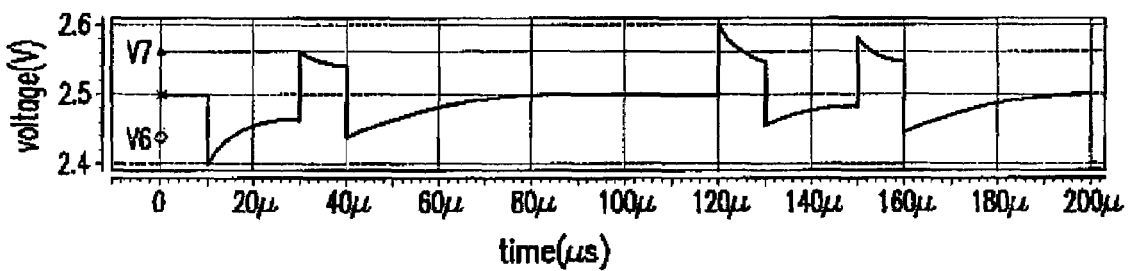
Figure 2:
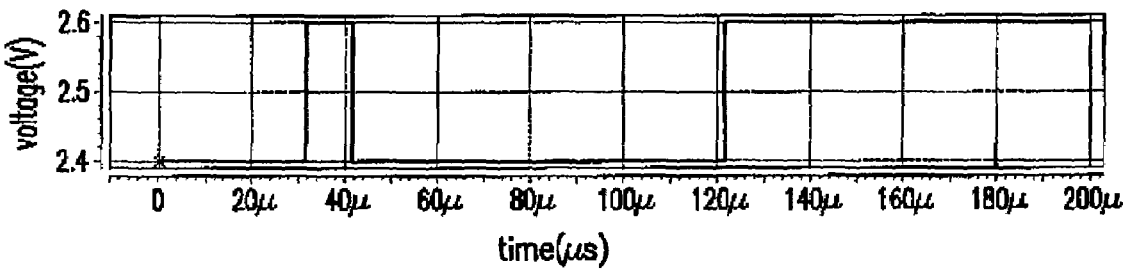
Figure 3:
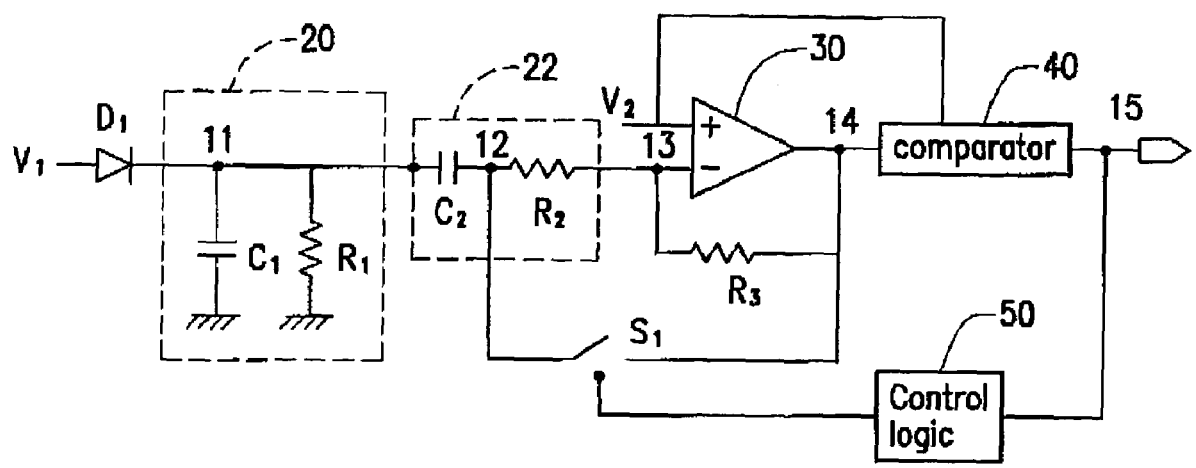
FIG. 3 is an exemplary circuit of a DC level wandering cancellation circuit according to one embodiment of the present invention.

FIG. 3 is an exemplary circuit of a DC level wandering cancellation circuit according to one embodiment of the present invention. The DC level wandering cancellation circuit comprises a low pass filter 20 for receiving an input voltage VI; a high pass filter 22 coupled to the low pass filter 20; an amplifier 30 coupled to the high pass filter 22 for receiving a reference voltage V2 and an output signal of the high pass filter 22; a comparator 40 coupled to the amplifier 30 for receiving an output signal of the amplifier 30 to compare the reference voltage V2 with the output signal of the amplifier 30 at a node 14; a resistor R3 coupled between outputs of the high pass filter 22 and the amplifier 30 (i.e., between nodes 13 and 14); a control logic 50 coupled to the comparator 40 for receiving a compared result from the comparator 40; and a switching means S1 coupled between the high pass filter 22 and the output of the amplifier 30. The amplifier 30 includes a positive terminal that is marked with a symbol "+", and a negative terminal that is marked with a symbol "−". The positive terminal of the amplifier 30 is provided for receiving the reference voltage V2, and the negative terminal of the amplifier 30 is provided for the input voltage V1 via the low pass filter 20 and the high pass filter 22. The switching means S1 is turned on for a predetermined interval by the control logic 50 according to the compared result.

In one embodiment of the present invention, referring to FIG. 3, the switching means S1 is a transistor, such as a MOS transistor. The low pass filter 20 further comprises a first resistor R1 and a first capacitor C1 connected in parallel. The high pass filter 22 further comprises a second resistor R2 and a second capacitor C2 connected in series. The second capacitor C2 is coupled between the first and the second resistors R1, R2. In this configuration, the switching means S1 is coupled between the control logic 50 and a node 12 between the second capacitor C2 and the second resistor R2. A diode D1 can be further coupled to a common node 11 of the first resistor R1 and the first capacitor C1 of the low pass filter 20. Then, an input signal V1 is input to the low pass filter 20 through the diode D1.

The second resistor R2, the resistor R3 and the operational amplifier 30 form an inverting gain amplifier. The comparator 40 is used to compare the difference in voltage between the node 14 and the reference voltage V2. The control logic circuit 50 is used to sense the output node 15 of the comparator 40. The output of the control logic 50 is normally low. When the voltage at the node 15 changes from high to low, or from low to high, the output of the control logic 50 becomes high for a short time period, for example, 2 μs. As a result, the switching means S1 is then turned on accordingly for a short period of time when state transient occurs at the output of the comparator 40, i.e., at the node 15. Then, the output of the amplifier 30 is feed back to the high pass filter 22, i.e., the node 12. In this way, the nodes 14 and 12 are shorted for the short time period, and the voltage at node 14 can come back to a stable point quickly. Therefore, the DC wandering effect can be removed and the output result of the comparator 40 at the node 15 is correct.

Figure 4:
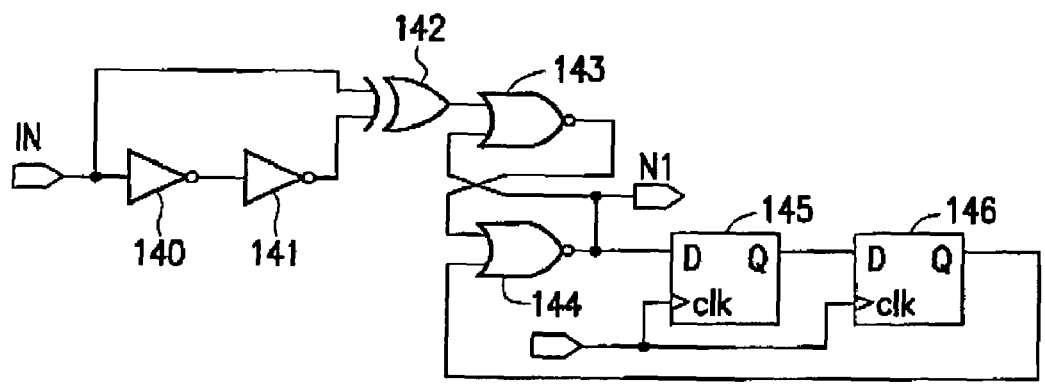
FIG. 4 is an exemplary circuit of the control logic in FIG. 3.

FIG. 4 is an exemplary circuit of the control logic in FIG. 3. For detail description of the functional operation of the control logic 50 shown in FIG. 3, the control logic 50 can be configured in the circuit structure in FIG. 4. The control logic 50 comprises a first inverter 140, a second inverter 141, a XOR gate 142, a first NOR gate 143, a first NOR gate 144, a first D-type flip flop 145 and a second D-type flip flop 146. The input terminal IN of the control logic 50 is coupled to the input terminal of the first inverter 140 for receiving the compared result from the comparator 40, and the output terminal of the first inverter 140 is coupled to the input terminal of the second inverter 141. The XOR gate 142 is configured to receive the output signal of the second inverter 141 and the input signal at the input IN of the control logic 50. The output terminal of the XOR 142 is coupled to the first input terminal of the first NOR gate 143. The second input terminal of the first NOR gate 143, the output terminal of the NOR gate 144 and the input terminal D of the first D-type flip flop 145 are coupled together at a node N1. The first input terminal of the second NOR gate 144 is coupled to the output terminal of the first NOR gate 143. The second input terminal of the second NOR gate 144 is coupled to the output terminal Q of the second D-type flip flop 146. The output terminal Q of the first D-type flip flop is coupled to the input terminal of the second D-type flip flop 146. The input terminals clk of the first and the second D-type flip flop are coupled together for receiving a clock signal.

Figure 5:
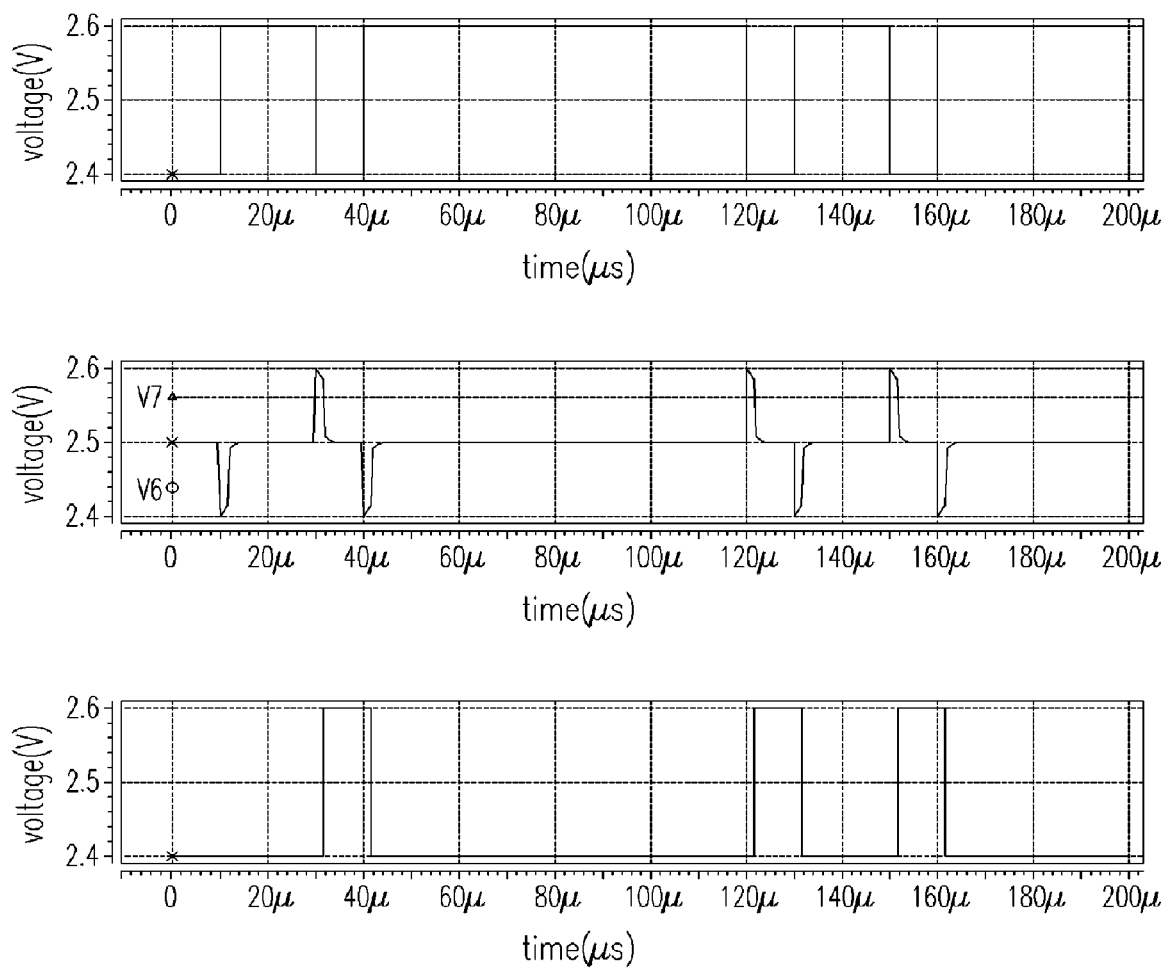
FIG. 5 is the simulation result of the present invention.

FIG. 5 shows a simulation result of the above embodiment. The curve in first row shows the input signal V1. The second row shows the input terminal of the comparator 40 at the node 15. The second row also shows a hysterias upper bound V7 and a lower bound V6. The third row shows the output terminal of the comparator 40 at the node 15. When the comparator output terminal 15 has a state change from high to low, or low to high, the switching means S1 is turned on, and the nodes 12, 14 are shorted for a short period of time. The result is that the voltage of the node 14 returns back to the stable point much faster than if there is no the control logic circuit 50 and the switching means S1. From FIG. 4, there is state change in the voltage at the node 15 after time is 122 μsec, and the DC wandering is removed. Thus, there is no DC wandering effect and the output of the comparator 40 at the node 15 is as expected without any distortion.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A DC level wandering cancellation method for a circuit having an inverting-gain amplifier, the method comprising:
   said inverting-gain amplifier receiving an input voltage via a low pass filter and a high pass filter, wherein the high pass filter is coupled to the low pass filter;
   comparing an output signal of the inverting-gain amplifier with a reference voltage; and
   feeding back the output signal of the inverting-gain amplifier to the inverting-gain amplifier when there is a state change in the compared result regardless of the number of changes of the input voltage.

2. The DC level wandering cancellation method of claim 1, wherein the state change is a level changed from high to low, or from low to high.

* * * * *